(12) United States Patent
Puri et al.

(10) Patent No.: US 10,020,772 B1
(45) Date of Patent: Jul. 10, 2018

(54) PORTABLE SOLAR ARRAY

(71) Applicant: Magnolia Solar, Inc., Woburn, MA (US)

(72) Inventors: Yash R. Puri, Lowell, MA (US); Robert D. Atherton, Jr., Haverhill, MA (US); Roger E. Welser, Providence, RI (US); Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 200 days.

(21) Appl. No.: 13/927,954

(22) Filed: Jun. 26, 2013

Related U.S. Application Data (60) Provisional application No. 61/665,413, filed on Jun. 28, 2012.

(51) Int. Cl.
*H02S 20/10* (2014.01)
*H02S 20/30* (2014.01)
*H02S 20/32* (2014.01)
*H02S 30/10* (2014.01)
*H02S 30/20* (2014.01)
*H02S 10/40* (2014.01)
*H01L 31/048* (2014.01)
*H02S 20/00* (2014.01)

(52) U.S. Cl.
CPC ............ *H02S 10/40* (2014.12); *H01L 31/048* (2013.01); *H02S 20/00* (2013.01); *H02S 20/10* (2014.12); *H02S 20/30* (2014.12); *H02S 20/32* (2014.12); *H02S 30/10* (2014.12); *H02S 30/20* (2014.12); *Y02E 10/50* (2013.01)

(58) Field of Classification Search
CPC ....... H01L 31/048; H02S 20/00; H02S 20/30; H02S 20/32; H02S 30/00; H02S 30/10; H02S 30/20; H02S 40/00; H02S 40/32; H02S 40/38; H02S 20/10; H02S 10/40; Y02E 10/50; Y02E 10/58
USPC .......................................... 136/244, 245, 251
See application file for complete search history.

(56) References Cited

U.S. PATENT DOCUMENTS

| | | | | |
|---|---|---|---|---|
| 2,229,475 A | * | 1/1941 | Redmer | F16B 7/105 248/188.5 |
| 4,476,854 A | * | 10/1984 | Baer | F24J 2/38 126/579 |
| 4,552,125 A | | 11/1985 | Borodulin et al. | |

(Continued)

*Primary Examiner* — Lindsay Bernier
(74) *Attorney, Agent, or Firm* — Loginov & Associates; William A. Loginov (57) ABSTRACT

This invention provides a portable system for the generation of photovoltaic energy. The power plant is provided as a kit in a plurality of containers, each of which can be carried by one person. This power plant can be assembled in a few hours by two people. The power plant is adjustable and can adapt to a variety of locations and environments. The power plant includes a frame structure, a movable photovoltaic collection array of more than one solar panel, a power management module, battery power storage system and various cables. The power plant can include shelving and can function as a vehicle port. The photovoltaic collection array can be pivotally raised and lowered for optimal solar power collection manually or mechanically. In further embodiments, more than one such power plant can be joined together to create a portable local power grid.

8 Claims, 6 Drawing Sheets

(56) References Cited

U.S. PATENT DOCUMENTS

| | | | | |
|---|---|---|---|---|
| 5,125,608 | A * | 6/1992 | McMaster | F24J 2/5232 |
| | | | | 126/570 |
| 6,201,181 | B1 * | 3/2001 | Azzam | H02S 40/38 |
| | | | | 126/600 |
| 6,354,511 | B1 | 3/2002 | Hardee | |
| 6,566,842 | B1 * | 5/2003 | Kirkpatrick | B60J 1/2091 |
| | | | | 320/101 |
| 2004/0124711 | A1 * | 7/2004 | Muchow | F03D 9/007 |
| | | | | 307/64 |
| 2005/0241246 | A1 * | 11/2005 | Sinha | F24J 2/5203 |
| | | | | 52/173.3 |
| 2009/0256046 | A1 * | 10/2009 | Hausner | F24J 2/5232 |
| | | | | 248/398 |
| 2011/0132353 | A1 * | 6/2011 | Gumm | F24J 2/5233 |
| | | | | 126/680 |

* cited by examiner

PORTABLE SOLAR ARRAY

RELATED APPLICATIONS

This application claims the benefit of U.S. Provisional Application Ser. No. 61/665,413, filed Jun. 28, 2012, entitled PORTABLE SOLAR ARRAY, the entire disclosure of which is herein incorporated by reference.

FIELD OF THE INVENTION

The present application relates to small-scale portable power sources and more particularly to small-scale photovoltaic power sources.

BACKGROUND OF THE INVENTION

As mankind continues to develop around the world, the demand for energy continues to rise. Most energy used to power machines and generate electricity is derived from fossil fuels, such as coal, natural gas or oil. These supplies are finite and their combustion causes atmospheric pollution and the production of Carbon Dioxide, which is suspected to contribute to global climate change. Some alternative approaches to produce energy include the harnessing of nuclear energy, wind, moving water (hydropower), geothermal energy or solar energy. Each of these alternative approaches has drawbacks. Nuclear power requires large capital investments and safety and waste disposal are concerns. Wind power is effective, but wind turbines require a windy site, often far away from grid connections and take up large footprints of land. Hydropower requires the construction of large, potentially environmentally harmful dams and the displacement of large volumes of flowing water. Geothermal power requires a source of energy that is relatively near the surface—a characteristic not common to a large portion of the Earth—and has the potential to disrupt the balance of forces that exist inside the Earth's crust. Solar power is abundant and continues to be one of the cleanest and most available forms of renewable energy and it can be harnessed by direct conversion into electricity (solar photovoltaic) or by heating a working fluid (solar thermal).

Solar photovoltaic (PV) technology relies on the direct conversion of solar power into electricity through the photoelectric effect: solar radiation's quantized particles, or photons, impinging on semiconductor junctions may excite pairs of conduction electrons and valence holes. These charged particles travel through the junction and may be collected at electrically conductive electrodes to form an electric current in an external circuit.

Photovoltaic is one of the most promising technologies for producing electricity from renewable resources, for a number of reasons: 1. The photovoltaic effect in Si and other solid-state semiconductors is well understood and the technology fully validated; 2. PV power plants convert directly solar power into electrical power, have no moving parts and require low maintenance; 3. Solar radiation is quite predictable and is maximum during hours of peak electricity consumptions; and 4. The industry has been aggressively pursuing a performance improvement and cost reduction path similar to the Moore's law in semiconductor electronics, approaching the condition of market competitiveness with traditional energy resources in many parts of the world. In 2010, approximately 16 GW of solar photovoltaic were installed globally, over a 100% growth from global installations in 2009.

While photovoltaic electrical generation is promising, the power plants are generally fixed to a fixed structure. Commercially available power plants are not easily disassembled, relocated and reassembled. This fixation does not provide for portability. Whereas a conventional combustion fuel generator can be towed behind or placed in a vehicle and moved to a remote location, PV power plants remain fixed on structures or in permanently mounted arrays.

It is desirable that to provide a portable PV power plant that can be readily disassembled, transported and easily reassembled at a remote location. It is further desirable that such a power plant be provided as a kit that can be joined with like units to create a large array that can be generally free of any permanent fixation, and as such, present no issues of permanent change to the environment or terrain. It is also desirable that such a power plant provide sufficient power for a variety of purposes common to a remote, typically off-grid location.

SUMMARY OF THE INVENTION

This invention overcomes the disadvantages of the prior art by providing a portable system for the generation of photovoltaic energy. In providing such a system, the user transports a kit for the power plant in a plurality of containers, each of which can be carried by one person. This power plant can be assembled in a few hours by two people. The power plant is adjustable and can adapt to a variety of locations and environments. The power plant includes a frame structure, a movable photovoltaic collection array of more than one solar panel, a power management module, battery power storage system and various cables. The power plant can include shelving and can function as a vehicle port.

In an illustrative embodiment, the portable power system is constructed from framing that is rectilinear in profile and can define a variety of cross-sectional shapes, such as tubular, I-beam, or a purpose-built frame system with elongated grooves and joining orthogonal members together using locking members. The photovoltaic collection array can be hinged or pivotally raised and lowered through an arc for optimal solar power collection manually. The raising or lowering can be performed mechanically, including electrically-powered or manually powered hydraulics, cranks and/or electrical motors. In alternate embodiments, more than one such power plant can be joined together in an array to create a portable local power grid.

In an illustrative embodiment, the portable solar array includes a plurality of discrete photovoltaic panels arranged in a two-dimensional grid on a frame structure. The frame structure includes a plurality of legs joined thereto. A hinge assembly is constructed and arranged to allow the panels to move within an arc. The hinges are located on a first side and the riser bars are located on a second side, opposite the first side. The panels are therein secured at a predetermined angular orientation by a riser assembly. The array also includes a power management unit that operatively connected to the panels to provide power in a desired configuration (e.g. 120 VAC, 12 VDC, 24 VAC, 24 VDC, etc.). The power management system can include a batter assembly and can be mounted on a shelf or other supporting structure with respect to the frame. At least one of the legs can be adjustable for height. Likewise, in an illustrative embodiment, the array comprises two columns of three panels each, or another arrangement that provides six adjacent panels. Illustratively, the legs define a height constructed and arranged to enable the array to be used as at least one of an enclosed habitation or a car port. The height adjustment is accomplished by raising and lowering the panel and the mechanism includes riser bars, swivel jointed mounting blocks and a plurality of hinges. The height adjustment mechanism includes a locking mechanism having a locking pin. The legs are stabilized by angle braces.

BRIEF DESCRIPTION OF THE DRAWINGS

The invention description below refers to the accompanying drawings, of which.

DETAILED DESCRIPTION

Figure 1:
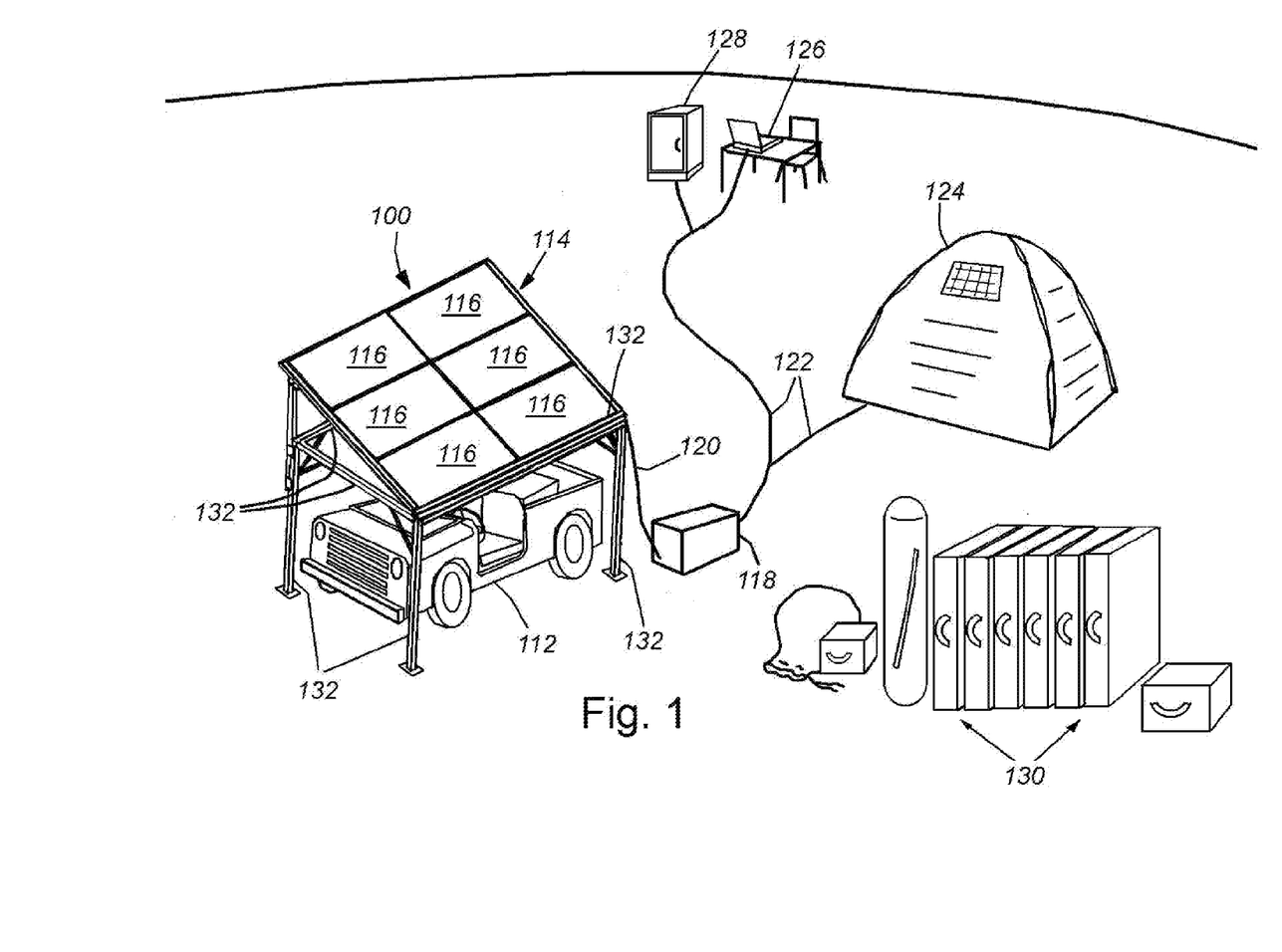
FIG. 1 is a perspective view of a portable solar array in operation in a remote location according to an illustrative embodiment.

A portable modular solar photovoltaic ("PV") power plant 100 is shown in an assembled configuration in use in the field is shown in FIG. 1 according to an illustrative embodiment. The power plant 100 is sufficiently sized in width, length and height that an exemplary truck-type vehicle 112 can be parked beneath the power plant 100 and the power plant 100 can optionally serve as a carport for the vehicle 112. In an embodiment, the vehicle 112 can be an electrical vehicle that is recharged by some of the power created by the power plant 100. The illustrative photovoltaic collection array 114 is an assembly of a plurality of discrete photovoltaic solar panels 116 arranged in a two-dimensional grid on a frame structure. Each solar panel 116 can be a single integral or unitary unit of conventional size and shape, having, for example, an output in the 180 Watt to 240 Watt-range. The panels can be constructed with a metal, polymer or composite frame, and a plurality of individual cells electrically joined to an interconnecting substrate. The panel can be covered with transparent glass or polymer. Each panel illustratively has a size of approximately 62 inches by 32 inches. While the power plant 100 as depicted in FIG. 1 is provided with six solar panels 116, it is expressly contemplated that the power plant can have more or less panels, according to operational demands, and accordingly, be sized larger or smaller. The illustrative collection array 114 is shown as having solar panels 116 arranged in two columns of three panels each. It is contemplated that this arrangement can vary, depending on the shape and dimensions of the solar panels 116.

The power collected by the modules is fed through a power management module (not shown) and into the battery power storage unit 118 via a power cable 120. The batteries can comprise conventional lead-acid cells, lithium cells, nickel-metal-hydride cells, or any other electrical storage medium, including but not limited to ultra-capacitors. The battery power storage unit 118 is an array of one or more batteries that collect and store power for distribution during periods of reduced solar light or night. The size and storage capacity of the batteries can vary to meet the requirements of the particular operation. The power is then distributed through feed cables 122 for use in powering electronic accessories in specific locations, in this example, a tent/habitation 124, and additional electronic devices, for example, a laptop computer 126 and a small refrigerator 128. The power output for the power plant as depicted in FIG. 1 is approximately 1.4 kilowatt-hours.

The exemplary modular power plant 100 is transported as a kit in an disassembled configuration in one or more appropriately sized containers 130. It is contemplated that each of the solar panels 116 can be placed into an individual case that is sized and weighted so that a human of average size and strength can carry it from the transporting vehicle to the place of assembly (in compliance with any applicable Occupational Safety and Health Administration regulations). Each container can include the parts needed for each step of the assembly and it is contemplated that multiple parts for several assembly steps can share a container. Sensitive electrical components are stored in padded containers for durability. The containers can be provided with integral roller wheels for mobility. The structural members and cables can be provided with carry sacks. It is expressly contemplated that the module cases can be rigid or non-rigid and formed of appropriate metallic and/or non-metallic materials, including but not limited to aluminum, high-impact polymers or canvas. It is desirable that all of the sensitive electronic components be transported in containers that are sufficiently padded and sealed to withstand a variety of weather conditions, temperature, moisture and dryness.

The illustrative solar power plant 100 of FIG. 1 includes a PV collection array 114. It is expressly contemplated that when operational power requirements exceed the output of a single power plant 100 that more power plants can be emplaced, as needed, and linked together to make a local power grid. The illustrative power plant 100 as depicted in FIG. 1 as being sited in a remote location and can be used to power various activities, including but not limited to camping, hunting expeditions, habitations, construction projects, scientific expeditions and other activities.

The total weight of the components of the exemplary power plant 100 comprised of six panels weighs approximately 700 pounds when disassembled and arranged in its various transportation containers. The power plant can be assembled by a two man team with little to no experience in approximately three hours. It is contemplated that the various parts and connectors used in the assembly process are standardized so that a minimum of tools is necessary.

The frame members 132 of the power plant 100 are composed of a rigid metallic or non-metallic material, including lightweight aluminum. The frame elements can be constructed of commercially available system consisting of modular T-slotted aluminum beams and locking members that can be moved slidably along the beams to a desired location. The locking members interconnect with ends of other beams, and thereby allow two beams to be interconnected in a generally orthogonal relationship. It is expressly contemplated that other rigid materials, for example, fiberglass, steel or polymers can be used in the construction of the frame.

Figure 2:
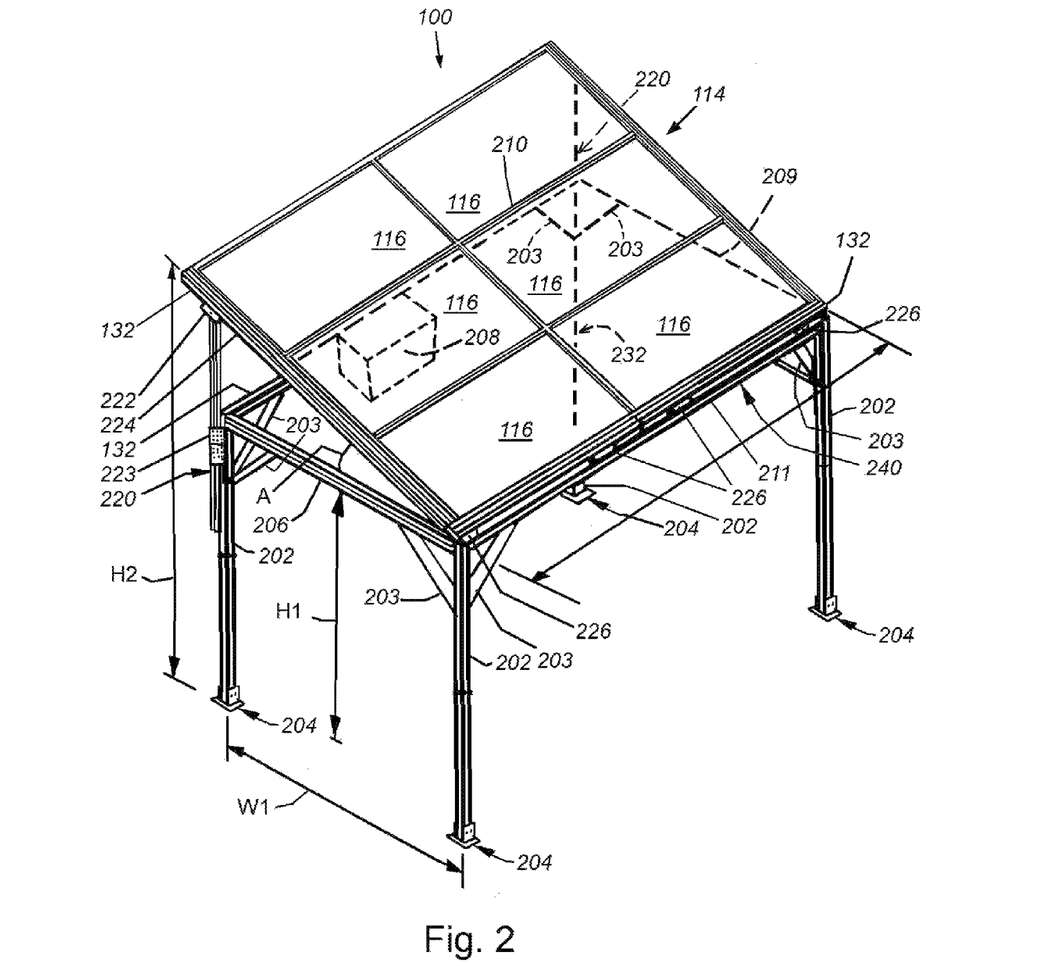
FIG. 2 is a perspective view of the portable solar array of FIG. 1 according to the illustrative embodiment.

FIG. 2 depicts the power plant 100 of FIG. 1 in an assembled configuration. The power plant has a plurality of legs 202 connected to the frame. In the illustrative embodiment the power plant has four legs 202, each of which is furnished with a "foot" 204 that protects the bottom of the respective frame member and provides a stable platform for the power plant. The legs 202 can be equipped with telescoping members that lock in place using a retaining pin or other retaining locking mechanism, including a spring-loaded detent pin or through-bolt and nut. The foot 204 can be flat, have a spike, castors or a height adjustment assembly. Angle braces 203 are used in an illustrative embodiment to stabilize the legs. One or more of the legs can be individually adjusted upwardly and downwardly to create a stable and level platform for the PV collection array 114. At least one of the legs includes a height adjustment assembly. The height H1 of the power plant from the ground to the horizontal frame member 206 is approximately 84.4 inches in an illustrative embodiment. This height is highly variable in alternate embodiments. The overall height H2 of the power plant can vary, depending on the raised angle A of the PV array 114. The array 114 can be pivotally raised or lowered through an arc of 20 degrees. When the angle of A is 0 degrees, the overall height H2 is approximately 88 inches. Angle A is shown in FIG. 2 to be at the maximum elevation angle, 20 degrees, resulting in an overall height H2 of approximately 124.3 inches in an embodiment. As angle A decreases, the overall height H2 will correspondingly decrease. In alternate embodiments, a power plant can have a PV collection array that is capable of elevation of more than 20 degrees.

The length L1 of the exemplary power plant 100 is approximately 129.5 inches. The width W1 is approximately 85.6 inches. It is expressly contemplated that these dimensions can vary higher or lower, depending on the necessity of larger or smaller arrays and the size dimensions of the component solar panels.

The power plant 100 includes a portable modular power management unit 208 that includes an inverter and can have integral battery power storage or a separate battery storage system. The solar panels 116 are connected to the power management unit 208. In the illustrative embodiment, the modular power management unit 208 is attached to frame member 210. It is expressly contemplated that the power management unit can be attached to frame members 206, 209, 210, 211 or mounted on an optional shelf that has been mounted on one of the frame members 206, 209, 210, 211. The shelf can also traverse the power plant's framing, connecting frames 210 and 211 or 206 and 209. Alternatively, the shelf can be substituted in whole or part by mounting brackets or other securing assemblies that elevate the electronics package generally above the ground. If the battery storage system is separate from the overall power management unit 208, the battery storage system can be placed adjacent to the power management unit on a shelf, attached to one or more locations on the frame or placed outside of the power plant structure.

The angular orientation of the PV collection array 114 is arrangeable for the optimal collection of sunlight for conversion into PV power. The height adjustment is accomplished by the raising and lowering of the PV collection array 114 is accomplished by the action of a riser assembly mechanism consisting of a pair of riser bars 220, swivel jointed mounting blocks 222, locking blocks 223 and a plurality of hinges 226. The hinges 226 are located on a first side and the riser bars 220 are located on a second side, opposite the first side. Each of the riser bars 220 is attached to the PV collection array 114 by a swivel jointed mounting block 222 that travels laterally back and forth within a track 224 inscribed in the frame 132 material. The riser bars 220 are movably connected by locking blocks 223 that are attached to legs 230, 232. The risers bars 220 can be manually raised or lowered and move within channels in the locking block 222. When the risers are in position for desired elevation of the PV collection array 114, the risers are locked in place by a locking mechanism that can include an engaging locking wedge, locking pin, key or other appropriate locking mechanism. In an alternate embodiment, the locking block 222 can include a raising mechanism that is a rack and pinion mechanism, a manually or electrically operated hydraulic piston, electro-magnetic motor or another mechanism.

It can be desirable for an operator to adjust and readjust the elevation of the PV collection array 114 during the course of a day for optimization of solar energy collection. The user elevates or lowers the PV collection array 114 by causing the riser bars 220 to rise or fall. This adjustment causes the mounting blocks 222 to travel within tracks 224. When the mounting blocks 222 move in the tracks 224, the PV collection array 114 confronts the hinges 226 along the fixed side 240 of the power plant. This directly translates the raising and lowering of the riser bars 220 in the angular motion of the PV collection array 114. The elevation is arrested by a pair of stops 227 mounted on the risers 220. These stops 227 prevent the PV collection array 114 from rising too far and help to stabilize the electronics and the array.

Figure 3:
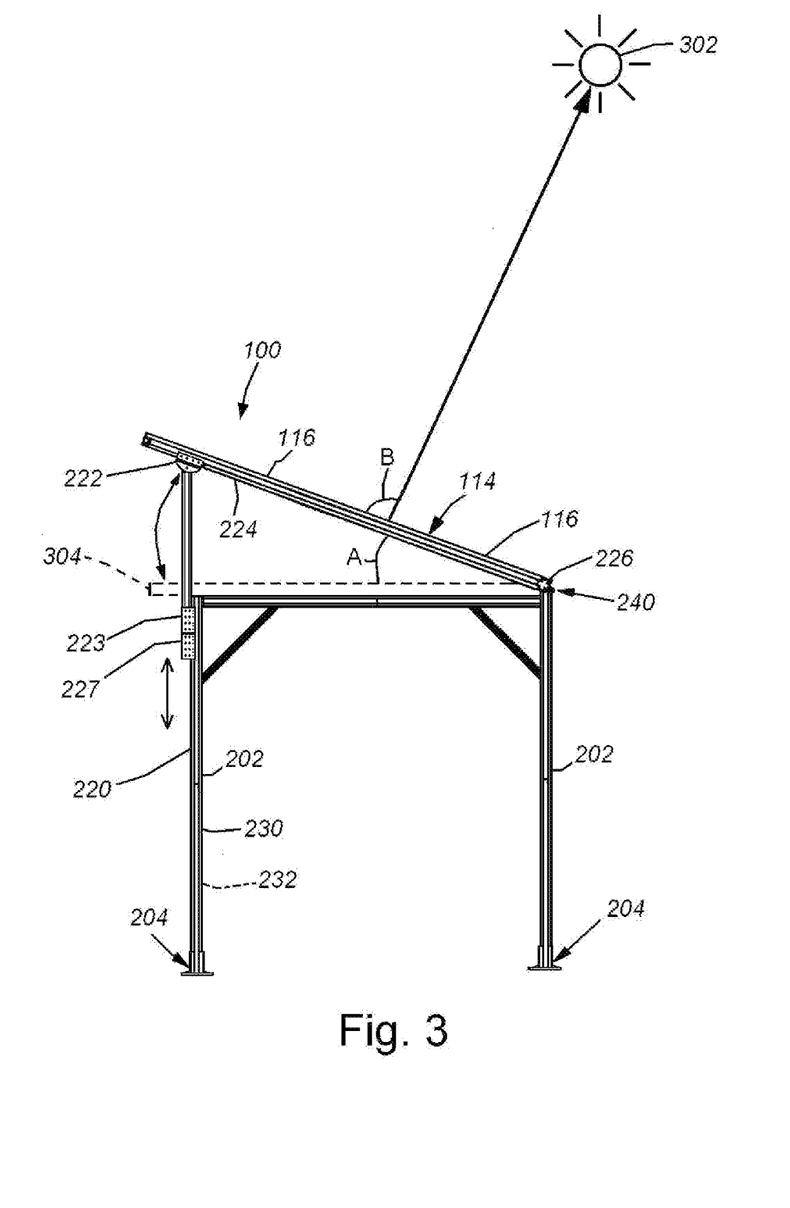
FIG. 3 is a side view of the portable solar array of FIG. 1 showing the arrangement of a photovoltaic collection array relative to the sun according to the illustrative embodiment.

The relative orientation of the PV collection array 114 to the sun 302 is shown in FIG. 3. The position of the sun 302 relative to the horizon will vary depending on the latitude of the operator, time of day and the time of year. In order to compensate for this, the PV collection array 114 can be raised or lowered, as set forth above, to maintain the optimal solar orientation angle B. When the power plant is not in use or the sun is directly overhead, the PV collection array 114 can be reclined to a neutral position 304.

Figure 4:
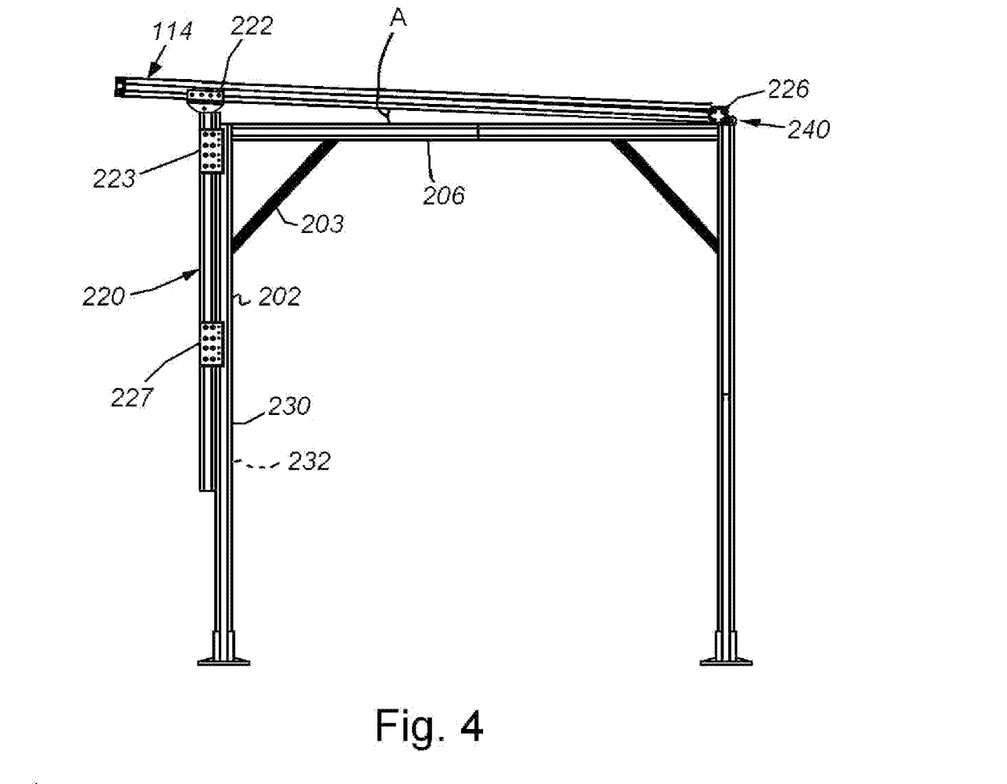
FIG. 4 is a side view of the portable solar array of FIG. 1 showing the retraction of the photovoltaic collection array relative to the sun according to the illustrative embodiment.

The PV collection array 114 in a lowered position, with angle A approaching 0 degrees is shown in FIG. 4. The stops 227 are widely separated from the locking blocks 223. This configuration can be utilized when the sun is overhead relative to the power plant 100 or when the power plant is not in use or when this orientation optimizes available solar energy.

Figure 5:
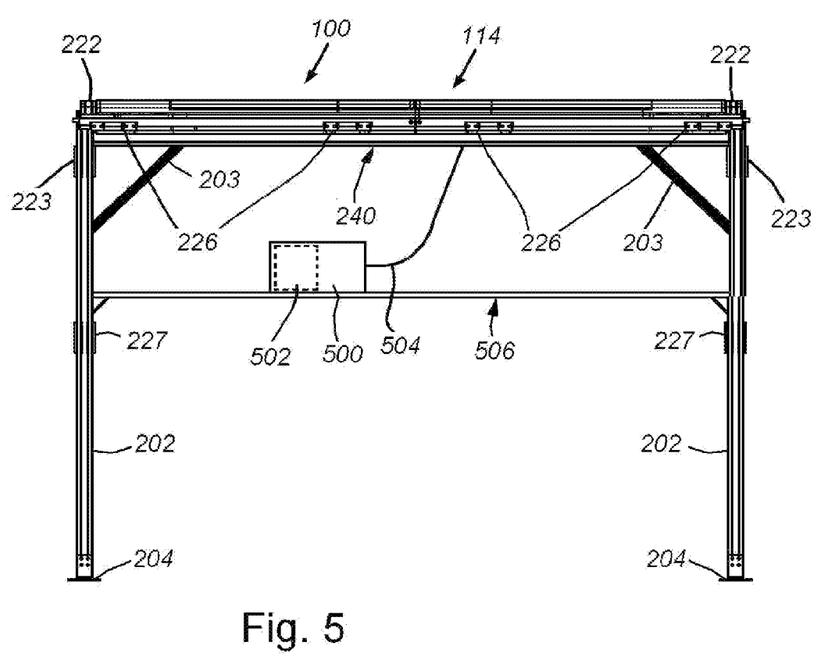
FIG. 5 is a frontal view of the portable solar array of FIG. 1 showing an optional shelf for holding the power management module and/or storage batteries according to the illustrative embodiment.

The power plant 100 is shown from the fixed side 240 in FIG. 5. In this embodiment, the power management module 500 has an integral battery power storage unit 502 and is connected to the PC collection array 114 by a cable 504. The power management module 500 is mounted on a shelf 506 that has been installed between two legs 202. The power management module 500 can be securely mounted (if desired) to the shelf 506 by metal or polymer straps, bolts, clamps or any other commercially available securement device that is connectable and disconnect able to enhance portability.

Figure 6:
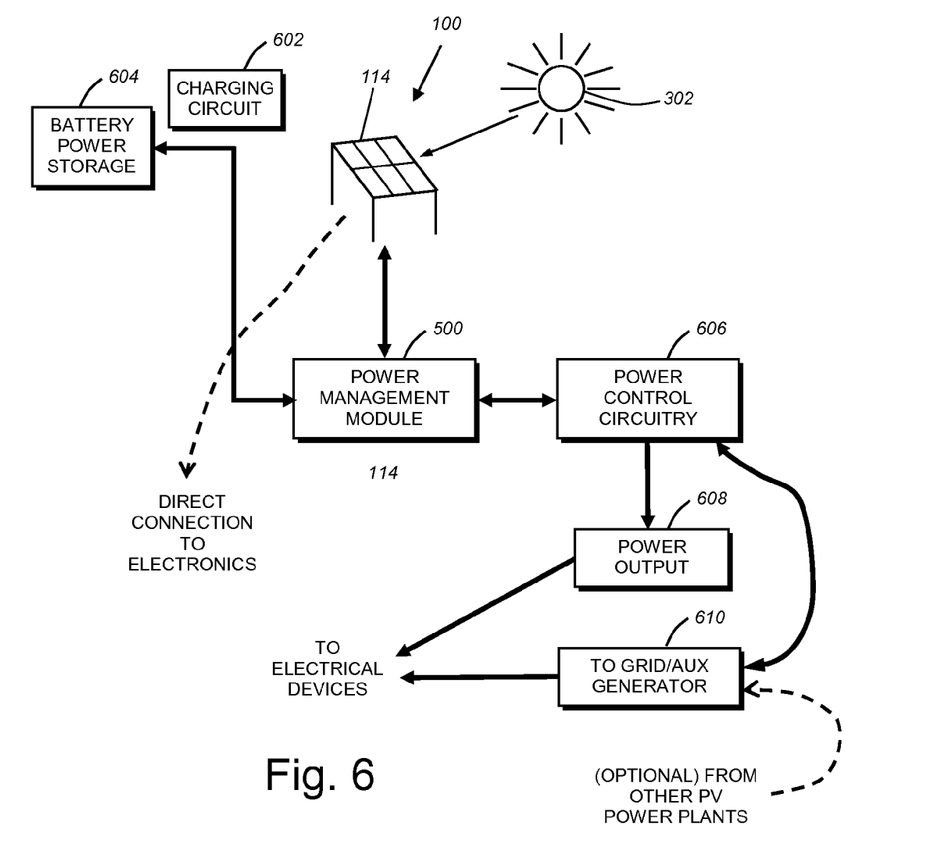
FIG. 6 is a flow chart showing the relationship of the components and the power and control signal path through the interconnected components of the portable solar array according to the illustrative embodiment.

FIG. 6 is a diagram that depicts the relative functions of the power plant 100. Photovoltaic power emitted by the sun 302 is collected by the PV collection array 114. The PV energy is transmitted to an inverter in the power management module 500 for conversion from DC current to AC current. Some or all of the PV power is diverted through a charging circuit 602 into the battery power storage 604. The main power feeds from the power management module 500 to the power control circuitry 606, where it becomes power output 608 for the dependent electronic devices or can be supplied into the grid. Likewise, the overall arrangement can include an auxiliary generator 610 to meet demands when the installed solar array's output is insufficient to meet demand. It is expressly contemplated that where the electrical output requirements exceed the output of a single portable power plant that one or more additional power plants can be assembled and linked together to become a portable grid. These units can be placed in close proximity to each other or widely dispersed, depending on the available terrain and local foliage and/or structures. The mated array can be served by individual power arrangement/battery mix or multiple places can be served by a central power arrangement and battery unit or units.

The power plant can be constructed with a master control panel and battery-powered electrical motors for raising or lowering the riser bars, thereby allowing the master control to determine the position of the sun relative to the horizon, the positional coordinates of the power plant, the direction of its orientation and cause the PV collection array to automatically assume the optimal angular setting for the best collection of solar energy. This master control can also re-position the PV collection array over time to maintain that optimal elevation. In the event that the power plant is to be used in regions of unstable ground or great wind, the various frame members can be fitted with eyebolts for the attachment of stabilization lines that are secured to the ground by pegs. A ladder can be included as part of the power plant.

In further alternate embodiments, the array and components can be constructed from suitable lightweight materials for transportation on spacecraft for extraplanetary exploration purposes, for example, an extraplanetary rover or habitat. In further embodiments, the frame of the power plant can be formed of tubular cylinders, with the corresponding modifications for movement of the mounting blocks in tracks during raising and lowering. A tenting kit can be provided with fabric panels (for example, canvas, nylon, etc.) that attach to the framework to create an enclosed structure. Where more than one power plant is in use, these can be linked to make an elongated structure. Additional battery power storage units can be included to increase the overall battery power storage. The legs can be provided with loops and/or flanges for attachment to pegs for anchoring the assembly.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, various frame members can be furnished with small integral level bubbles for ease in proper placement and assembly. The PV collection array can have more or less than six solar panels. The individual solar panels can be sized dimensionally larger or smaller and have a stronger or weaker output, thereby increasing or decreasing the overall power output of the power plant. The solar panels can be replaced with higher efficiency panels. Also, as understood herein, the use of positional language, for example, "front" and "back", "up" and "down", "front" and "rear", "top" and "bottom" and the like are relative conventions only, and are not absolute with respect to a reference coordinate system such as the acting direction of gravity. Accordingly, this description is meant to be taken only by way of example, and not to otherwise limit the scope of this invention.

What is claimed is:

1. A portable solar array comprising:
   a plurality of photovoltaic (PV) panels arranged in a two-dimensional grid on a PV frame structure;
   a base frame structure comprising four joined frame members;
   a plurality of telescoping legs joined directly to the base frame structure;
   a hinge assembly connecting the PV frame structure to the base frame structure, the hinge assembly comprising a plurality of hinges constructed and arranged to allow the panels to move within an arc;
   a riser assembly that secures the photovoltaic panels at a predetermined angular orientation, the riser assembly including a plurality of riser bars that each move along a respective axis defined by a respective one of the plurality of legs, wherein the plurality of riser bars are respectively attached to the PV frame on opposite first and second sides by a plurality of swivel-jointed blocks that move laterally respectively within a plurality of track assemblies defined by the PV frame structure;
   a plurality of stops mounted on the plurality of riser bars and configured to prevent the photovoltaic panels from extending beyond the arc; and
   a power management unit operatively connected to the photovoltaic panels,
   wherein the plurality of hinges are disposed on a third side of the PV frame structure.

2. The portable solar array as set forth in claim 1 wherein the power management unit is mounted on the base frame structure.

3. The portable solar array as set forth in claim 2 wherein the photovoltaic panels are arranged in two columns, each column having three photovoltaic panels.

4. The portable solar array as set forth in claim 1 further comprising a locking mechanism having a locking pin.

5. The portable solar array as set forth in claim 2 wherein the plurality of legs define a height constructed and arranged to enable the portable solar array to be used as at least one of an enclosed habitation and a car port.

6. The portable solar array as set forth in claim 1 wherein the plurality of legs are stabilized by angle braces.

7. The portable solar array as set forth in claim 1, wherein the arc is in the range of 0 to 20 degrees.

8. The portable solar array as set forth in claim 1 wherein the power management unit comprises an inverter and a battery.

* * * * *